United States Patent [19]

Kwon

[11] Patent Number: 5,703,505
[45] Date of Patent: Dec. 30, 1997

[54] SIGNAL RECEPTION APPARATUS HAVING AUTOMATIC LEVEL SELECTION FUNCTION

[75] Inventor: Ki Jo Kwon, Kyungki-Do, Rep. of Korea

[73] Assignee: Goldstar Electron Co., Ltd., Cheongju, Rep. of Korea

[21] Appl. No.: 369,456

[22] Filed: Jan. 6, 1995

[30] Foreign Application Priority Data

Nov. 9, 1994 [KR] Rep. of Korea ............... 29325/1994

[51] Int. Cl.$^6$ ............................................. H03K 5/22
[52] U.S. Cl. ........................ 327/75; 327/76; 327/99
[58] Field of Search ............................ 327/74, 75, 76, 327/534, 99

[56] References Cited

U.S. PATENT DOCUMENTS

| | | | |
|---|---|---|---|
| 3,721,975 | 3/1973 | Brinkman et al. | 340/347 AD |
| 3,935,569 | 1/1976 | Marcel et al. | 340/347 AD |
| 4,006,412 | 2/1977 | Campbell et al. | 324/96 |
| 4,918,451 | 4/1990 | Ando et al. | 341/159 |
| 5,060,083 | 10/1991 | Ueno | 358/464 |
| 5,070,255 | 12/1991 | Shin | 327/408 |
| 5,093,733 | 3/1992 | Satake | 358/455 |
| 5,438,593 | 8/1995 | Karam et al. | 327/75 |
| 5,495,247 | 2/1996 | Yamamoto et al. | 341/159 |

FOREIGN PATENT DOCUMENTS 61-137076  6/1986  Japan ............................... 327/74

Primary Examiner—Timothy P. Callahan
Assistant Examiner—Kenneth B. Wells
Attorney, Agent, or Firm—Fleshner & Kim

[57] ABSTRACT

A signal reception apparatus has an automatic level selection function. A comparing circuit compares a level of an input signal with a plurality of sensing levels and outputs a plurality of sensing signals in accordance with the compared result. An auto select level controller receives the plurality of sensing signals from the comparing circuit and selects one of the plurality of sensing levels in response to the plurality of sensing signals. The auto select level controller includes a plurality of flip flop stages. Each of the plurality of flip flop stages has a plurality of flip flops connected in series and is coupled to a corresponding one of the plurality of sensing signals from the comparing circuit. A circuit receives the output signals from the plurality of flip flop stages and selects one of the plurality of sensing levels in response to the inputted sensing signals.

8 Claims, 4 Drawing Sheets

SIGNAL RECEPTION APPARATUS HAVING AUTOMATIC LEVEL SELECTION FUNCTION

BACKGROUND OF THE INVENTION

1. Field of the Invention

The present invention relates in general to a signal reception apparatus for a computer network, and more particularly to a signal reception apparatus having an automatic level selection function.

2. Description of the Prior Art

Generally, in a computer network in which a signal line is connected from one workstation or personal computer to the other workstation or personal computer, a discrimination must be made between a signal component and a noise component to perform efficiently a signal reception function even in the case where the signal line is long.

Referring to FIG. 1, there is shown a circuit diagram of a conventional signal reception apparatus. As shown in this drawing, input signals RD+ and RD− of complementary levels are applied to nodes 1 and 2, respectively. The input signal RD+ is directly applied to a non-inverting input terminal (+) of a comparator C1 and the input signal RD− is applied through a resistor R3 to an inverting input terminal (−) thereof. Also, the input signal RD+ is directly applied to a non-inverting input terminal (+) of a comparator C2 and the input signal RD− is applied through the resistor R3 and a resistor R4 to an inverting input terminal (−) thereof. An output signal from the comparator C1 is supplied to a data buffer DB1, which generates valid reception data RD in response to a reception enable signal from the comparator C2. Here, the resistors R3 and R4 are offset resistors for determining a noise suppression level with respect to the input signals RD+ and RD−.

For example, provided that a resistance of each of the resistors R3 and R4 is an offset resistance R0, the input signal RD− is voltage-dropped by R0 and then compared with the input signal RD+ by the comparator C1. Also, the input signal RD− is voltage-dropped by 2R0 and then compared with the input signal RD+ by the comparator C2.

Namely, an offset voltage (noise suppression level) applied to the inverting input terminal (−) of the comparator C1 can be defined as follows:

$$Vr \text{ or } Vo = \{R0/(R1+2R0+R5)\}Vp$$

where, Vr or Vo is the offset voltage and Vp is a peak voltage value of the input signal RD−.

Also, a voltage (reception signal sensing level) applied to the inverting input terminal (−) of the comparator C2 can be defined as follows:

$$Vrs = \{2R0/(R1+2R0+R5)\}Vp$$

Therefore, the comparator C1 outputs the reception data to the data buffer DB1 only when the voltage {Vrd×R6/(R2+R6)} at its non-inverting input terminal (+) is greater than the above-mentioned voltage Vr or Vo at its inverting input terminal (−), where Vrd is a voltage value of the input signal RD+. Also, the comparator C2 outputs the reception enable signal to the data buffer DB1 only when the voltage {Vrd×R6/(R2+R6)} at its non-inverting input terminal (+) is greater than the above-mentioned voltage Vrs at its inverting input terminal (−).

The voltages Vr or Vo and Vrs are determined by the resistances. Noticeably, it is impossible to sense an input signal having a level smaller than Vrs (=2Vr) due to a signal attenuation produced as the signal line becomes longer.

In other words, the above-mentioned conventional signal reception apparatus has a disadvantage in that it cannot efficiently perform the reception function for the input signal having a low level due to the signal attenuation, because the noise suppression level and the reception signal sensing level are fixed.

SUMMARY OF THE INVENTION

Therefore, the present invention has been made in view of the above problem, and it is an object of the present invention to provide a signal reception apparatus having an automatic level selection function, which is capable of performing efficiently a reception function even for an input signal of a small level.

In accordance with the present invention, the above and other objects can be accomplished by provision of a signal reception apparatus having an automatic level selection function, comprising comparing means for comparing a level of an input signal with a plurality of sensing levels and outputting a plurality of sensing signals in accordance with the compared result; and auto select level control means for inputting said plurality of sensing signals from said comparing means and selecting one of said plurality of sensing levels corresponding to said level of said input signal in response to the inputted signals.

The auto select level control means includes a plurality of flip flop stages, each of said plurality of flip flop stages having a plurality of flip flops connected in series to a corresponding one of said plurality of sensing signals from said comparing means; and means for providing output signals from said plurality of flip flop stages and selecting one of said plurality of sensing levels corresponding to said level of said input signal in response to the inputted signals.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Figure 1:
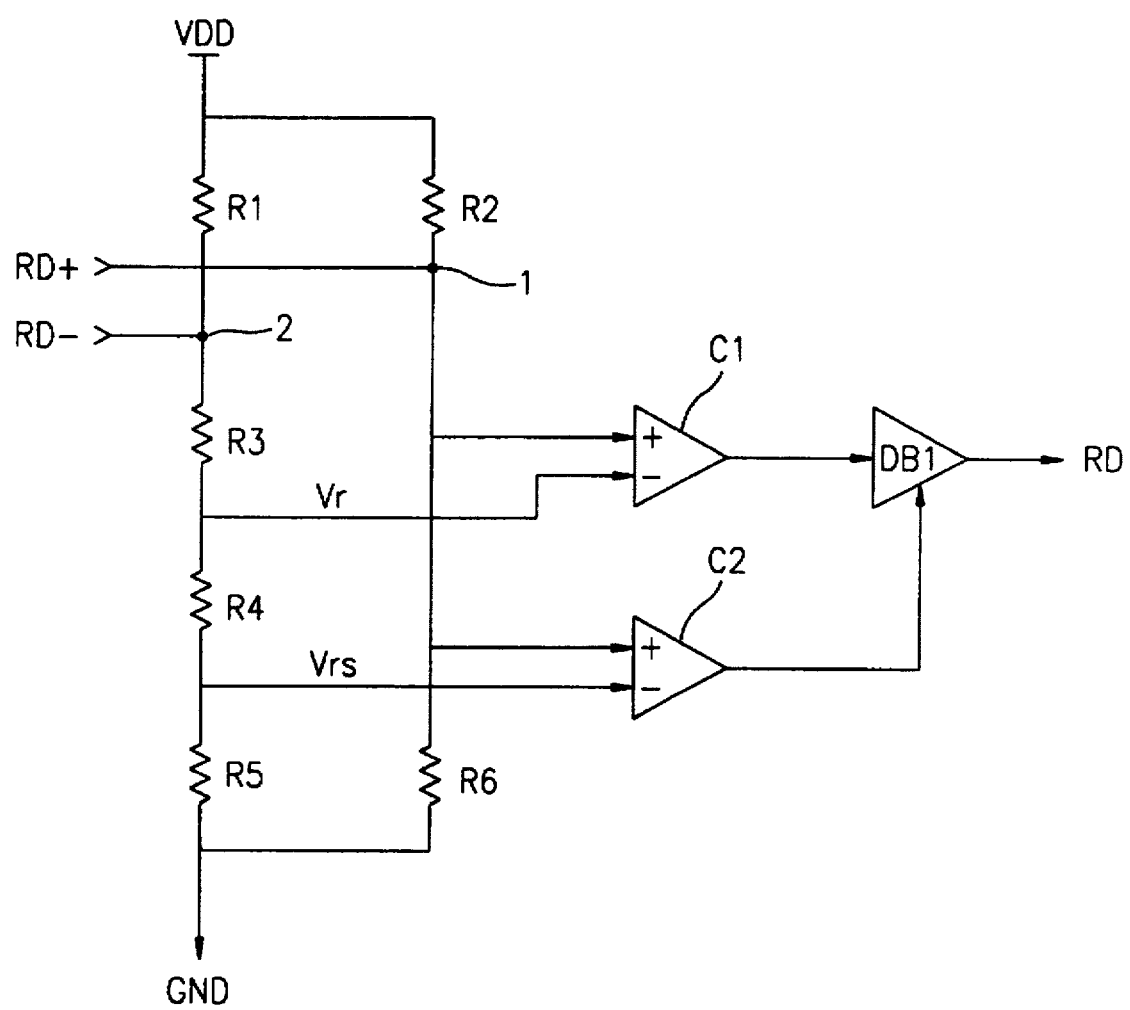
FIG. 1 is a circuit diagram of a conventional signal reception apparatus.
Figure 2:
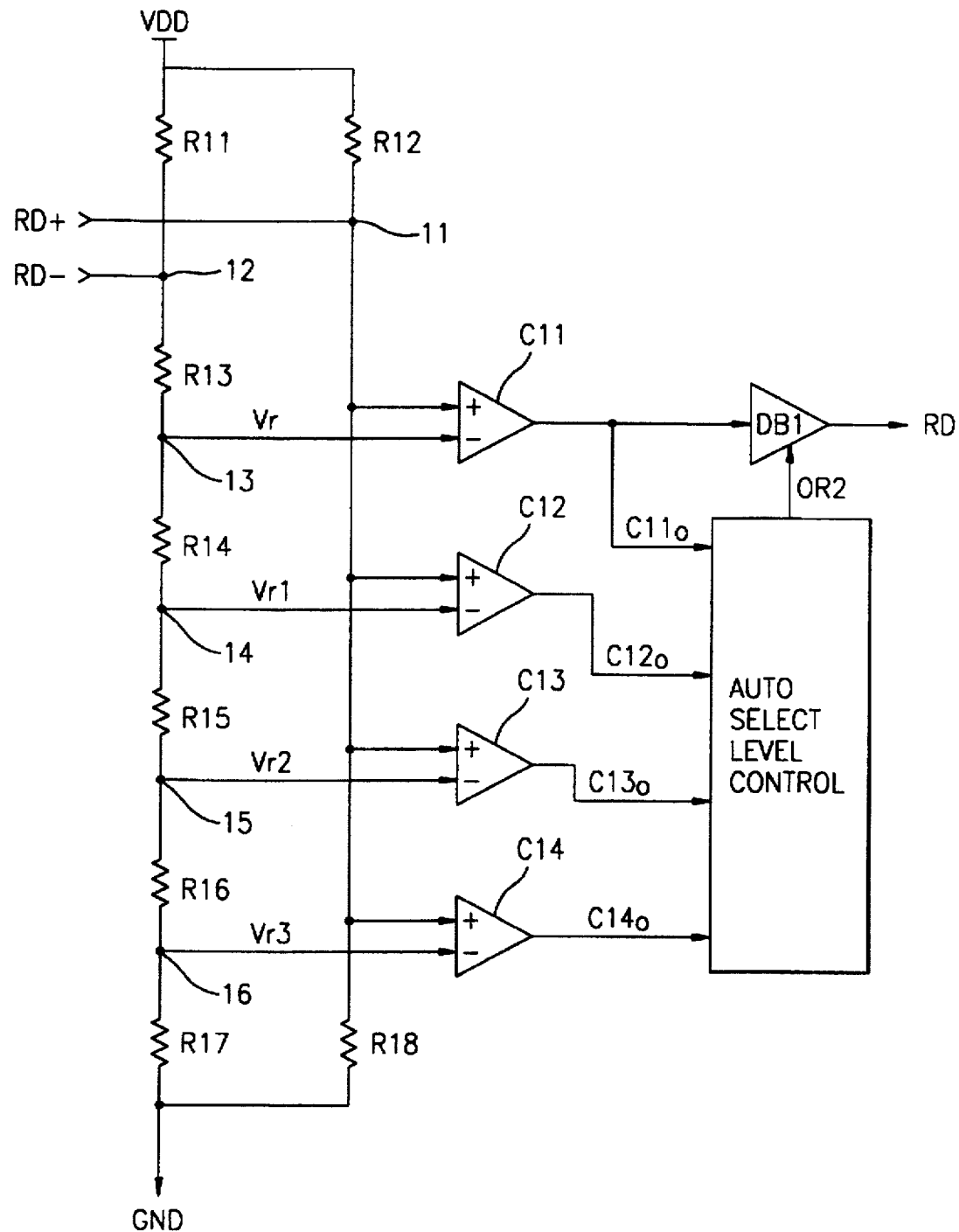
FIG. 2 is a circuit diagram of a signal reception apparatus in accordance with the present invention.

Referring to FIG. 2, there is shown a circuit diagram of a signal reception apparatus in accordance with the present invention. As shown in this drawing, the signal reception apparatus comprises four comparators C11, C12, C13 and having non-inverting input terminals (+) for receiving an input signal RD+ directly.

The non-inverting input terminals (+) of the comparators C11, C12, C13 and C14 are commonly connected to an input node 11 for the input terminal RD+. A resistor R12 is connected between the input node 11 for the input signal RD+ and a supply voltage VDD. A resistor R18 is connected between the input node 11 and a ground voltage GND. An input node 12 for an input signal RD− is connected to the supply voltage VDD through a resistor R11. Also, the input node 12 is connected to a first node 13 of an inverting input terminal (−) of the comparator C11 through an offset resistor R13. An offset resistor R14 is connected between the first node 13 and a second node 14 of an inverting input terminal (−) of the comparator C12. An offset resistor R15 is connected between the second node 14 and a third node 15 of an inverting input terminal (−) of the comparator C13. An offset resistor R16 is connected between the third node 15 and a fourth node 16 of an inverting input terminal (−) of the comparator C14, which is also connected to the ground voltage GND through a resistor R17.

An output signal or noise suppression data from the comparator C11 is applied to a data buffer DB, which generates valid reception data VRD. The output signal from the comparator C11 is also applied to an auto select level controller 10 together with output signals from the comparators C12, C13 and C14.

The auto select level controller 10 is adapted to receive the output signals from the comparators C11, C12, C13 and C14 and generates a reception enable signal φRE to control the data buffer DB according to a sensing level of the input signals RD+ and RD−.

Figure 3:
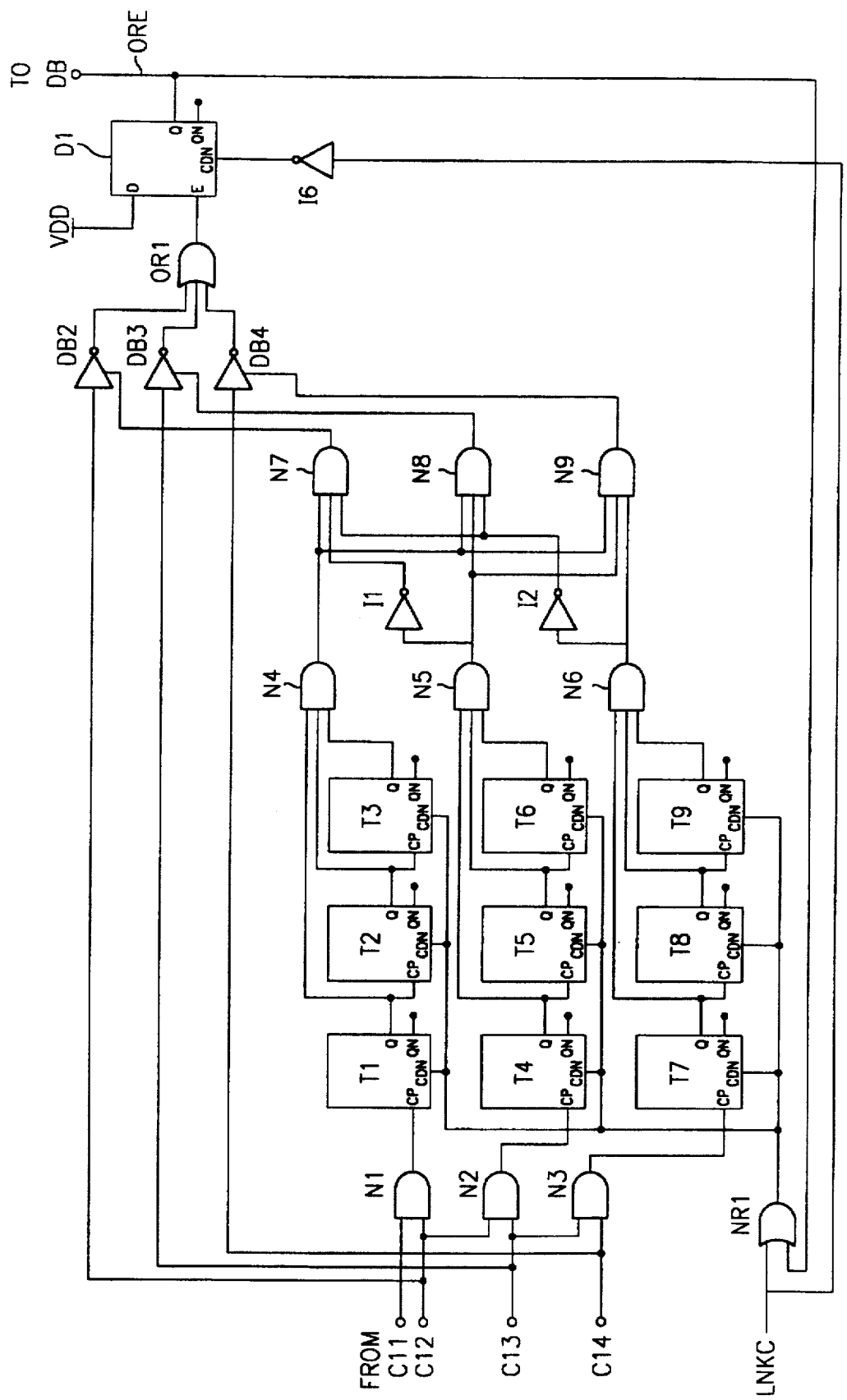
FIG. 3 is a circuit diagram of an auto select level controller in FIG. 2.

Referring to FIG. 3, there is shown a circuit diagram of the auto select level controller 10 in FIG. 2. As shown in this drawing, the output signals from the comparators C11 and C12 are applied to an AND gate N1 and the output signals from the comparators C12 and C13 are applied to an AND gate N2. The output signals from the comparators C13 and C14 are applied to an AND gate N3. An output signal from the AND gate N1 is applied as a clock pulse signal to an input terminal CP of a T-flip flop T1.

An output terminal of the T-flip flop T1 is connected to an input terminal CP of a T-flip flop T2, an output terminal of which is connected to an input terminal CP of a T-flip flop T3. Output signals from the T-flip flops T1–T3 are applied to an AND gate N4. An output signal from the AND gate N2 is applied as a clock pulse signal to an input terminal CP of a T-flip flop T4.

An output terminal of the T-flip flop T4 is connected to an input terminal CP of a T-flip flop T5, an output terminal of which is connected to an input terminal CP of a T-flip flop T6. Output signals from the T-flip flops T4–T6 are applied to an AND gate N5. An output signal from the AND gate N3 is applied as a clock pulse signal to an input terminal CP of a T-flip flop T7.

An output terminal of the T-flip flop T7 is connected to an input terminal CP of a T-flip flop T8, an output terminal of which is connected to an input terminal CP of a T-flip flop T9. Output signals from the T-flip flops T7–T9 are applied to an AND gate N6. Applied to control terminals CDN of the T-flip flops T1–T9 is an output signal from a NOR gate NR1 which inputs a link sense signal LNKC for setting initial states of the T-flip flops T1–T9. The NOR gate NR1 also receives the reception enable signal φRE, as will be described in detail later.

An output signal from the AND gate N4 is directly applied to an AND gate N7. An output signal from the AND gate N5 is inverted by an inverter I1 and then applied to the AND gate N7. An output signal from the AND gate N6 is inverted by an inverter I2 and then applied to the AND gate N7. Also, the output signals from the AND gates N4 and N5 are directly applied to an AND gate N8. The output signal from the AND gate N6 is inverted by the inverter I2 and then applied to the AND gate N8. Further, the output signals from the AND gates N4–N6 are directly applied to an AND gate N9. An output signal from the AND gate N7 controls a data buffer DB2 receiving the output signal from the comparator C12. An output signal from the AND gate N8 controls a data buffer DB3 receiving the output signal from the comparator C13.

Also, an output signal from the AND gate N9 controls a data buffer DB4 inputting the output signal from the comparator C14. Output signals from the data buffers DB2–DB4 are applied to an OR gate OR1, an output signal of which is supplied to a D-flip flop D1. The link sense signal LNKC is inverted by an inverter I6 and then applied to a control terminal of the D-flip flop D1. As a result, an output signal from the D-flip flop D1 is the reception enable signal φRE for controlling the data buffer DB in FIG. 2.

Figure 4:
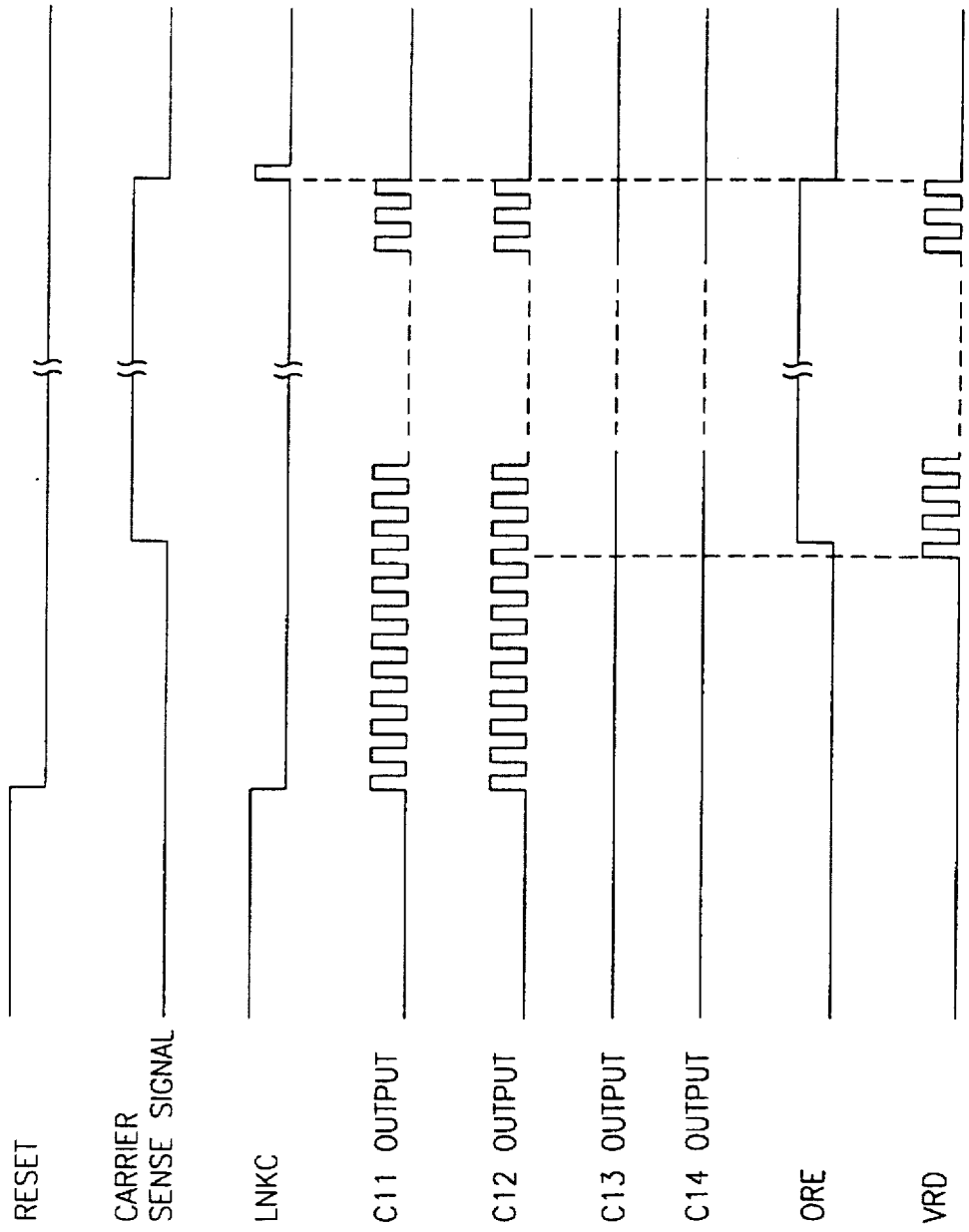
FIG. 4 is a waveform diagram of signals from components in FIGS. 2 and 3.

The operation of the signal reception apparatus with the above-mentioned construction in accordance with the present invention will hereinafter be described in detail with reference to FIG. 4, which is a waveform diagram of the signals from the components in FIGS. 2 and 3.

For example, it is assumed that a resistance of the offset resistor R13 in FIG. 2 is R0 and a resistance of each of the offset resistors R14–R16 in FIG. 2 is R0/3. In FIG. 2, an offset voltage can be defined as follows:

$$Vr \text{ or } Vo = VDD \times R0/(R11 + R0 + R12)$$

where, Vr or Vo is the offset voltage.

As a result, voltages Vr1, Vr2 and Vr3 applied to the inverting input terminals (−) of the comparators C12–C14 are 4Vo/3, 5Vo/3 and 2Vo, respectively. In FIG. 3, when the T-flip flops T1–T9 are initialized in response to the link sense signal LNKC, low signals are applied to control terminals of the data buffers DB2–DB4.

Thereafter, when the link sense signal LNKC becomes low in level, the T-flip flops T1–T9 are operated in response to the output signals from the comparators C12–C14. If the output signals from the T-flip flops T1–T9 constituting three stages with respect to the output signals from the comparators C12–C14 become all high in level, the output signals from the AND gates N7–N9 all become high in level.

Noticeably, the T-flip flops T1–T9 constitute the three stages with respect to the output signals from the comparators C12–C14 to ensure the sensing reliability of the reception signal. Here, the number of the stages may be adjusted as needed.

A level of the valid reception data VRD is determined according to the levels of the output signals from the AND gates N7–N9 passed respectively through the data buffers DB2–DB4. Namely, if the input signals to the OR gate OR1 are all high in level, the level of the valid reception data VRD is determined as Vr3. Also, if the output signals from the data buffers DB2 and DB3 are high in level and the output signal from the data buffer DB4 is low in level, the level of the valid reception data VRD is determined as Vr2. On the other hand, in the case where the output signal from the data buffer DB2 is high in level and the output signals from the data buffers DB3 and DB4 are low in level, the level of the valid reception data VRD is determined as Vr1.

In other words, the levels of the sensing signals Vr1, Vr2 and Vr3 from the comparators C12–C14 are discriminated and the level of the valid reception data VRD is set to the corresponding level in accordance with the discriminated result.

As apparent from the above description, according to the present invention, although the signal component is attenuated due to a line load, the level of the received signal is sensed and the valid reception data is determined in accordance with the sensed result. Therefore, the reliability of the valid reception data can be increased. Also, because the selected valid reception data can have various levels, an appropriate reception data level can be applied according to a characteristic of a medium in a computer network.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A signal reception apparatus having automatic level selection function, comprising:

a plurality of comparing means, each for comparing a received input signal with one of a plurality of sensing levels of said input signal and each outputting a sensing signal in accordance with such a comparison;

auto select level control means for receiving said sensing signal from each of said plurality of comparing means for generating a reception enable signal according to the sensing signal which is selected by said auto select level control means; and a first data buffer for receiving the sensing signal from one of said plurality of comparing means and outputting the received sensing signal as valid reception data in response to the reception enable signal from the auto select level control means.

2. The signal reception apparatus according to claim 1, wherein said auto select level control means includes:

a plurality of flip flop stages, each of said plurality of flip flop stages having a plurality of first flip flops connected in series and each flip flop stage being coupled to a corresponding one of said plurality of sensing signals from said comparing means; and means for selecting an output signal from said plurality of flip flop stages and generating said reception enable signal according to said one of said output signals from said plurality of said flip flop stages.

3. The signal reception apparatus of claim 2, wherein said receiving means comprises:

circuitry, coupled to receive output signals from said flip flop stages, that performs a logical operation on the output signals of said flip flop stages;

a plurality of second data buffers, each second data buffer receiving a corresponding one of said plurality of sensing signals, and outputting the corresponding one of said plurality of sensing signals in response to a corresponding output signal of said logic circuitry;

a logic gate coupled to said plurality of second data buffers such that a logical operation is performed on the outputs of said plurality of second data buffers; and a second flip flop, coupled to said logical gate, for outputting the reception enable signal.

4. A signal reception apparatus comprising:

a plurality of comparators, each comparator comparing a first input signal with one of a plurality of second input signals;

a control circuit receiving signals outputted by said plurality of comparators to generate an enable signal, wherein said control circuit includes a plurality of first logic gates and a plurality of flip flop stages, each flip flop stage receiving a logical output of a corresponding first logic gate which has performed a logical operation on said signals outputted from said plurality of comparators; and means, coupled to one of said plurality of comparators and said control circuit, for generating one of said signals outputted from said plurality of comparators as an output signal in response to the enable signal of said control circuit.

5. The signal reception apparatus of claim 4, wherein said control circuit further includes logic circuitry, coupled to receive output signals from said flip flop stages, that performs a logical operation on the output signals of said flip flop stages;

a plurality of first data buffers, each first data buffer receiving a corresponding one of said signals from said plurality of comparators, and outputting the corresponding one of said signals of said plurality of comparators in response to a corresponding output signal of said logic circuitry;

a second logic gate coupled to said plurality of first data buffers such that a logical operation is performed on the outputs of said plurality of first data buffers; and a further flip flop, coupled to said second logic gate, for outputting the enable signal in response to an output of the second logic gate.

6. The signal reception apparatus of claim 5, wherein said control circuit generates the enable signal based on the signals outputted by said plurality of comparators.

7. The signal reception apparatus of claim 6, wherein said generating means comprises a second data buffer coupled to one of said comparators and said control circuit, wherein said second buffer responds to said enable signal such that one of said outputs of said plurality of comparators is outputted by the signal reception apparatus.

8. The signal reception apparatus of claim 7, wherein each flip flop stage comprises a plurality of flip flops coupled in series, and said logic circuitry receives an output from each of said series coupled flip flops.

* * * * *